United States Patent
Lin et al.

(10) Patent No.: US 11,562,968 B2
(45) Date of Patent: *Jan. 24, 2023

(54) APPARATUS FOR LITHOGRAPHICALLY FORMING WAFER IDENTIFICATION MARKS AND ALIGNMENT MARKS

(71) Applicant: Taiwan Semiconductor Manufacturing Co., Ltd., Hsin-Chu (TW)

(72) Inventors: Hu-Wei Lin, Hsinchu (TW); Chih-Hsien Hsu, Hsinchu (TW); Yu-Wei Chiu, Pingtung (TW); Hai-Yin Chen, Taipei (TW); Ying-Hao Wang, Tainan (TW); Yu-Hen Wu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

This patent is subject to a terminal disclaimer.

(21) Appl. No.: 16/402,574

(22) Filed: May 3, 2019

(65) Prior Publication Data

US 2019/0259710 A1  Aug. 22, 2019

Related U.S. Application Data

(60) Continuation of application No. 16/114,567, filed on Aug. 28, 2018, now Pat. No. 10,283,457, which is a
(Continued)

(51) Int. Cl.
*H01L 23/544* (2006.01)
*G03F 7/20* (2006.01)
(Continued)

(52) U.S. Cl.
CPC .............. *H01L 23/544* (2013.01); *G03F 7/20* (2013.01); *G03F 7/2002* (2013.01); *G03F 7/70* (2013.01);
(Continued)

(58) Field of Classification Search
CPC ............ H01L 21/0274; H01L 21/3086; H01L 21/67242; H01L 21/67282; H01L 23/544;
(Continued)

(56) References Cited

U.S. PATENT DOCUMENTS 4,477,182 A * 10/1984 Takanashi ........... G03F 7/70541
355/53
5,434,424 A * 7/1995 Stickel ................. G03F 7/70366
250/492.23
(Continued)

FOREIGN PATENT DOCUMENTS

CN  101369516 A  2/2009
JP  2004240189 A  8/2004
(Continued)

OTHER PUBLICATIONS

Non-Final Office Action dated Jan. 26, 2018 for U.S. Appl. No. 15/154,181.
(Continued)

*Primary Examiner* — Alia Sabur
(74) *Attorney, Agent, or Firm* — Eschweiler & Potashnik, LLC

(57) ABSTRACT

The present disclosure relates a lithographic substrate marking tool. The tool includes a first electromagnetic radiation source disposed within a housing and configured to generate a first type of electromagnetic radiation. A radiation guide is configured to provide the first type of electromagnetic radiation to a photosensitive material over a substrate. A second electromagnetic radiation source is disposed within
(Continued)

the housing and is configured to generate a second type of electromagnetic radiation that is provided to the photosensitive material.

20 Claims, 7 Drawing Sheets

Related U.S. Application Data division of application No. 15/154,181, filed on May 13, 2016, now Pat. No. 10,283,456.

(60) Provisional application No. 62/246,335, filed on Oct. 26, 2015.

(51) Int. Cl.
*H01L 21/027* (2006.01)
*H01L 21/67* (2006.01)
*F21K 9/00* (2016.01)
*G03F 9/00* (2006.01)
*H01L 21/308* (2006.01)

(52) U.S. Cl.
CPC .......... *G03F 7/7005* (2013.01); *G03F 7/7045* (2013.01); *G03F 7/70075* (2013.01); *G03F 7/70141* (2013.01); *G03F 7/70466* (2013.01); *G03F 7/70541* (2013.01); *G03F 7/70733* (2013.01); *H01L 21/0274* (2013.01); *H01L 21/3086* (2013.01); *H01L 21/67282* (2013.01); *F21K 9/00* (2013.01); *G03F 7/70991* (2013.01); *G03F 9/708* (2013.01); *H01L 21/0273* (2013.01); *H01L 2223/54426* (2013.01); *H01L 2223/54433* (2013.01)

(58) Field of Classification Search
CPC . H01L 2223/54426; H01L 2223/54433; H01L 2223/54406; H01L 21/68707; H01L 2223/544; G03F 7/70141; G03F 7/70541; G03F 7/7045; G03F 7/70275; G03F 7/70058; G03F 7/70733; G03F 7/707; G03F 7/7075; G03F 7/20; G03F 2007/2067; G03F 7/2045; G03F 7/70075; G03F 7/70125; G03F 7/70216; G03F 7/70366

See application file for complete search history.

(56) References Cited

U.S. PATENT DOCUMENTS

| | | | |
|---|---|---|---|
| 5,733,711 A * | 3/1998 | Juengling | G03F 7/2022 430/22 |
| 6,743,694 B2 | 6/2004 | Chung et al. | |
| 10,283,456 B2 * | 5/2019 | Lin | G03F 7/70141 |
| 10,283,457 B2 * | 5/2019 | Lin | H01L 21/3086 |
| 2004/0041104 A1 * | 3/2004 | Liebregts | G03F 7/70291 250/492.22 |
| 2004/0218168 A1 * | 11/2004 | Van Groos | G03F 7/70733 355/72 |
| 2005/0146721 A1 | 7/2005 | Consolini et al. | |
| 2007/0210460 A1 | 9/2007 | Thallner | |
| 2008/0239256 A1 * | 10/2008 | Nagasaka | G03F 9/7096 355/53 |
| 2009/0073406 A1 | 3/2009 | Finders et al. | |
| 2009/0233413 A1 | 9/2009 | Katayama | |
| 2011/0020104 A1 | 1/2011 | Lansbergen et al. | |
| 2012/0281408 A1 * | 11/2012 | Owen | F21V 29/673 362/249.01 |
| 2014/0049978 A1 * | 2/2014 | Stites | G03F 7/201 362/555 |
| 2017/0102551 A1 * | 4/2017 | Deguenther | G02B 13/0095 |

FOREIGN PATENT DOCUMENTS

| | | |
|---|---|---|
| TW | 473976 B | 1/2002 |
| WO | 03032081 A1 | 4/2003 |

OTHER PUBLICATIONS

Non-Final Office Action dated Oct. 4, 2018 for U.S. Appl. No. 16/114,567.
Notice of Allowance dated Jan. 30, 2019 for U.S. Appl. No. 16/114,567.

* cited by examiner

APPARATUS FOR LITHOGRAPHICALLY FORMING WAFER IDENTIFICATION MARKS AND ALIGNMENT MARKS

REFERENCE TO RELATED APPLICATIONS

This Application is a Continuation of U.S. application Ser. No. 16/114,567, filed on Aug. 28, 2018, which is a Divisional of U.S. application Ser. No. 15/154,181, filed on May 13, 2016, which claims the benefit of U.S. Provisional Application No. 62/246,335, filed on Oct. 26, 2015. The contents of the above-referenced Patent Applications are hereby incorporated by reference in their entirety.

BACKGROUND

Semiconductor fabrication facilities (FABs) are factories where integrated chips are manufactured. The fabrication of integrated chips is performed by operating upon a semiconductor wafer with a plurality of processing steps (e.g., etching steps, patterning steps, deposition steps, implantation steps, etc.) to form millions or billions of semiconductor devices on and within the semiconductor wafer. The semiconductor wafers are subsequently diced to form multiple integrated chips from a single wafer. Semiconductor FAB s often have throughputs of tens of thousands of wafer a month. Due to processing variations, the quality of different wafers may vary. Therefore, in order to track a wafer and its associated chips, identification marks are formed on each wafer. The identification marks facilitate traceability of wafers throughout the manufacturing process for fault analysis.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
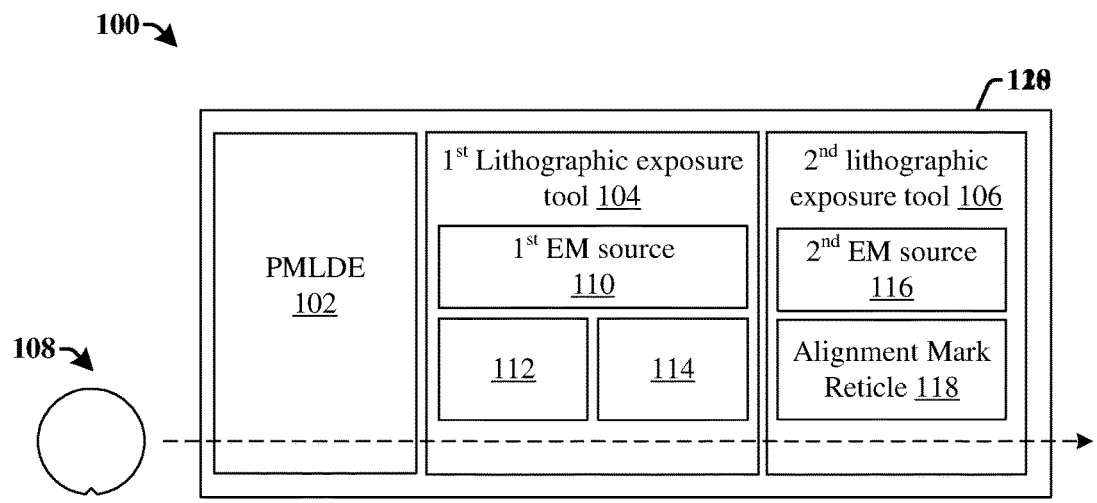
FIG. 1 illustrates some embodiments of a lithographic substrate marking tool configured to form a plurality of substrate identification marks within a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Identification marks are often formed in a semiconductor wafer prior to the formation of semiconductor devices. During a typical process of forming wafer identification marks, an oxide layer is formed over a semiconductor wafer. The oxide layer is patterned to form openings that correspond to alignment marks, and a surface of the semiconductor wafer is etched according to the oxide layer to form the alignment marks within the surface. A laser beam is subsequently focused and pulsed in a pattern that punctures the oxide layer to form multiple discrete pits arranged within the surface of the semiconductor wafer in the shape of an identification mark.

The high energy pulses of the laser beam can cause eruptions of molten material from the semiconductor wafer. The molten material may be deposited next to the pits and may subsequently result in the formation of micro-scratches along the surface of the semiconductor wafer (e.g., as the wafer is polishing during a shallow trench isolation polishing process). The oxide layer reduces splattering of the molten material. However, the oxide layer requires extra processing steps that increase a processing cost and time.

The present disclosure relates to a lithographic substrate marking tool configured to generate substrate identification marks using lithographic patterning. The use of lithographic patterning mitigates the negative consequences of laser marking and allows for concurrent formation of substrate identification marks and alignment marks. In some embodiments, the lithographic substrate marking tool comprises a first lithographic exposure tool arranged within a shared housing and configured to generate a first type of electromagnetic radiation during a plurality of exposures. A mobile reticle comprises a plurality of different reticle fields respectively configured to block a portion of the first type of electromagnetic radiation to expose a substrate identification mark within a photosensitive material overlying a semiconductor substrate. A transversal element is configured to move the mobile reticle so that separate ones of the plurality of reticle fields are exposed onto the photosensitive material during separate ones of the plurality of exposures. The mobile reticle therefore allows for different strings of substrate identification marks to be formed within the photosensitive material using a same reticle, thereby enabling economically viable lithographic substrate marking.

FIG. 1 illustrates some embodiments of a lithographic substrate marking tool 100 configured to form a plurality of substrate identification marks within a semiconductor substrate.

The lithographic substrate marking tool 100 comprises a photosensitive material deposition element 102, a first lithographic exposure tool 104, and a second lithographic exposure tool 106 arranged within a shared housing 120. The photosensitive material deposition element 102 is configured to form a photosensitive material onto a semiconductor substrate 108. In some embodiments, the photosensitive material may comprise a light sensitive polymer, such as a positive or negative photoresist.

The first lithographic exposure tool 104 comprises a first electromagnetic radiation source 110 configured to generate a first type electromagnetic radiation during an exposure. The first type of electromagnetic radiation is provided to a mobile reticle 112 configured to selectively block the first type electromagnetic radiation to expose a pattern (e.g., a chrome pattern) within the photosensitive material. The mobile reticle 112 comprises a plurality of different reticle fields. Each of the plurality of different reticle fields comprise a pattern corresponding to a substrate identification mark. In some embodiments, the plurality of reticle fields may comprise patterns corresponding to substrate identification marks that are alpha-numeric characters. For example, the mobile reticle 112 may comprise a first reticle field having a first pattern corresponding to a substrate identification mark 'A', a second reticle field having a second pattern corresponding to a substrate identification mark 'B', a third reticle field having a third pattern corresponding to a substrate identification mark 'C', etc.

A transversal element 114 is configured to move the mobile reticle 112 so that separate ones of the plurality of different reticle fields are projected onto the photosensitive film overlying the semiconductor substrate 108 during separate exposures of the first lithographic exposure tool 104. By moving the mobile reticle 112 during operation of the first lithographic exposure tool 104, the mobile reticle 112 can be used to expose a string of substrate identification marks into the photosensitive material. Furthermore, since each reticle field comprises a different substrate identification mark, the mobile reticle 112 can be used to generate different strings of substrate identification marks for different semiconductor substrates 108. For example, during a first plurality of exposures the mobile reticle 112 may be moved to a first plurality of positions that expose a first string of substrate identification marks (e.g., '20150001') in a photoresist layer over a first substrate, while during a second plurality of exposures the mobile reticle 112 may be moved to a second plurality of positions that expose a second string of substrate identification marks (e.g., '20150002') a photoresist layer over a second substrate.

The second lithographic exposure tool 106 comprises a second electromagnetic radiation source 116 configured to generate a second type of electromagnetic radiation, which is provided to an alignment mark reticle 118. The alignment mark reticle 118 comprises one or more blocking patterns (e.g., chrome patterns) corresponding to one or more alignment marks. The one or more blocking patterns are configured to selectively block the second type of electromagnetic radiation to expose one or more patterns corresponding to one or more alignment marks within the photosensitive material.

By using the first lithographic exposure tool 104 to form substrate identification marks within the photosensitive material, laser identification marking can be avoided. Furthermore, the second lithographic exposure tool 106 allows for a reduction in processing steps since a same etching step can be used to form both the substrate identification marks and the alignment marks, thereby reducing processing costs and time.

Figure 2:
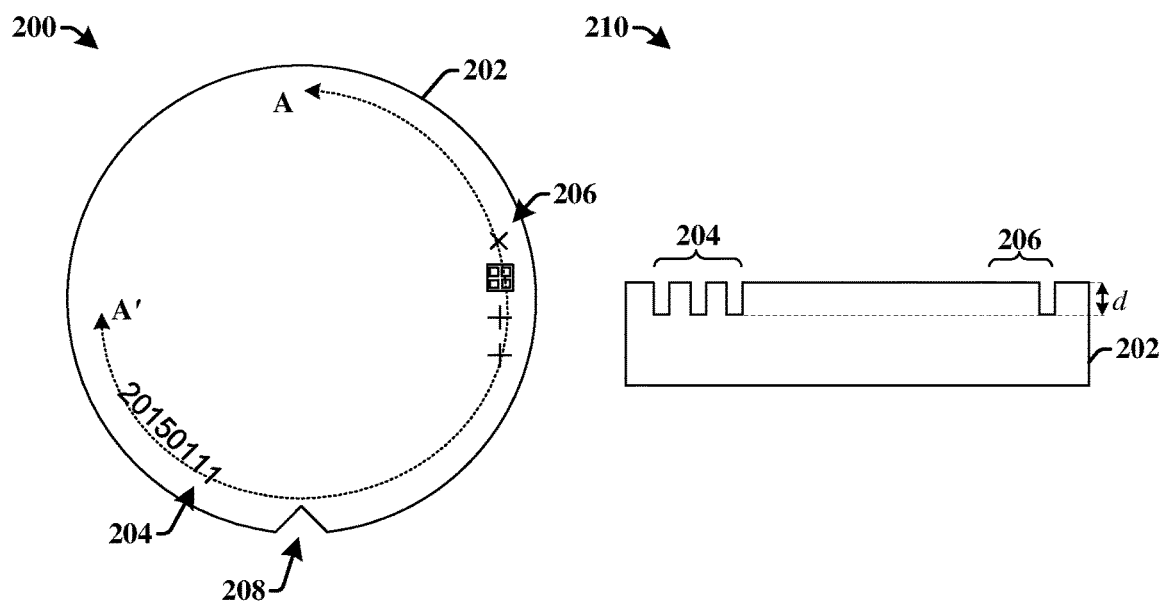
FIG. 2 illustrates some embodiments of a wafer formed by way of the disclosed lithographic wafer identification tool.

FIG. 2 illustrates some embodiments of a semiconductor wafer formed by way of the disclosed lithographic wafer marking tool.

As shown in top-view 200, the semiconductor substrate 202 comprises a plurality of wafer identification marks 204. The plurality of wafer identification marks 204 comprise depressions arranged within the semiconductor substrate 202. In some embodiments, the plurality of wafer identification marks 204 may comprise a plurality of alpha-numeric characters arranged next to one another as a string of characters. Respective ones of the wafer identification marks 204 may comprise a single, continuous depression within the semiconductor substrate 202. For example, a string having wafer identification marks "ABC" would have first continuous depression within the semiconductor substrate 202 in the shape of an "A", a second continuous depression within the semiconductor substrate 202 in the shape of a "B", and a third continuous depression within the semiconductor substrate 202 in the shape of a "C".

The semiconductor substrate 202 further comprises one or more alignment marks 206. The one or more alignment marks 206 also comprise depressions arranged within the semiconductor substrate 202. In some embodiments, the depressions of the wafer identification marks 204 extend into the semiconductor substrate 202 to a same depth d as the depressions of the one or more alignment marks 206, as shown in cross-sectional view 210 (shown along line A-A' of top-view 200). The one or more alignment marks 206 are configured to align with alignment marks on a photolithography reticle to provide for alignment during a lithographic process (e.g., when printing an overlying processing level, alignment marks on a reticle are aligned with the one or more alignment marks 206 to properly align the reticle).

Although the wafer identification marks 204 are shown as being rotated with respect to a notch 208 in the semiconductor substrate 202 (e.g., rotated by approximately 45 degrees relative to the notch 208 in the semiconductor substrate 202), it will be appreciated that in other embodiments, the location of the wafer identification marks 204 may be different. Furthermore, in some embodiments, the wafer identification marks may be covered by one or more overlying layers. For example, the wafer identification marks 204 may be covered by an inter-level dielectric layer and/or one or more metal interconnect layers.

Figure 3:
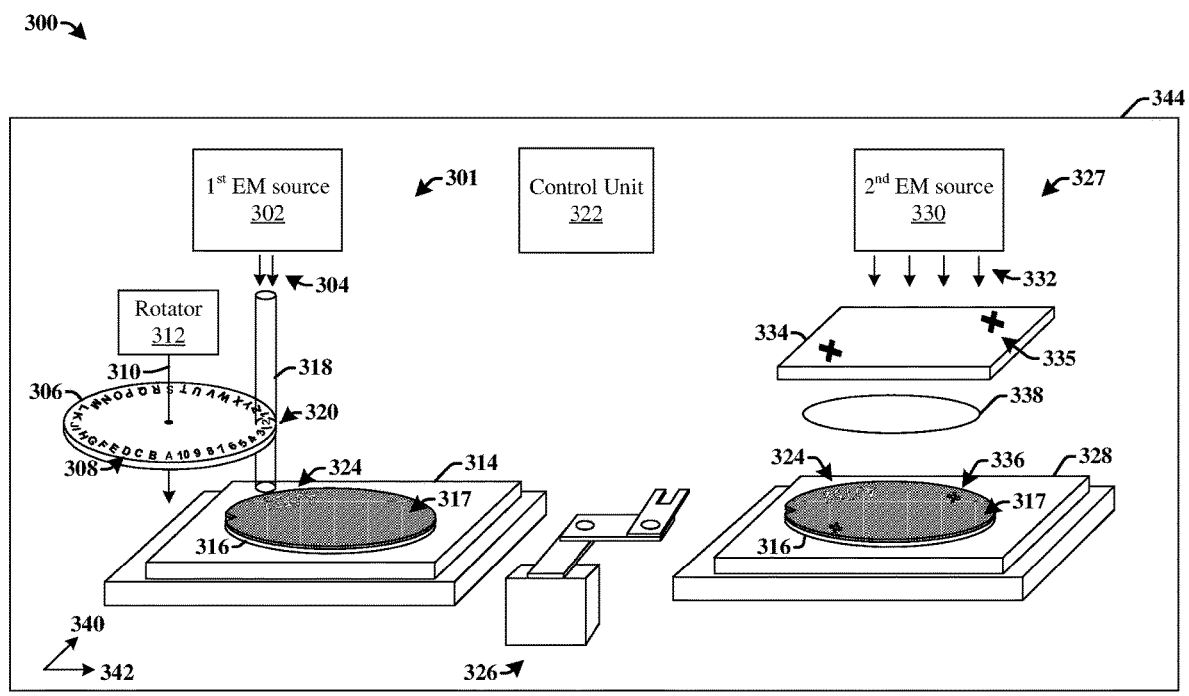
FIG. 3 illustrates some additional embodiments of a lithographic wafer marking tool having a rotatable reticle.

FIG. 3 illustrates some embodiments of a processing tool 300 configured to form a plurality of wafer identification marks within a semiconductor substrate.

The processing tool 300 comprises a first lithographic exposure tool 301 and a second lithographic exposure tool 327 arranged within a shared housing 344. The first lithographic exposure tool 301 comprises a first electromagnetic radiation source 302 configured to generate a first type of electromagnetic radiation 304. In some embodiments, the first electromagnetic radiation source 302 may comprise a LED (light emitting diode) light source configured to generate the first type of electromagnetic radiation 304 (e.g., ultraviolet radiation). In some embodiments, the LED light source may have a wavelength in a range of between approximately 250 nm and approximately 500 nm and a power in range of between approximately 5,000 mw/cm$^2$ and approximately 15,000 mw/cm$^2$. In other embodiments, the first electromagnetic radiation source 302 may comprise an alternative source of electromagnetic radiation, such as an excimer laser (e.g., comprising a krypton fluoride laser at 248 nm wavelength or an argon fluoride laser at 193 nm wavelength), for example.

The first type of electromagnetic radiation 304 is provided to a rotatable reticle 306 arranged between the first electromagnetic radiation source 302 and a first mobile wafer stage 314 (i.e., platform) configured to hold a semiconductor wafer 316. The first mobile wafer stage 314 is configured to move along a first direction 340 and along a second direction 342 perpendicular to the first direction 340. In some embodiments, the first mobile wafer stage 314 may comprise a vacuum wafer chuck.

The rotatable reticle 306 has a fixed center point and is configured to rotate along an axis of rotation 310 extending through the fixed center point. The rotatable reticle 306 comprises a plurality of different reticle fields 308 respectively configured to block a portion of the first type of electromagnetic radiation 304 to expose a wafer identification mark 324 within a photoresist layer 317 on the semiconductor wafer 316. In some embodiments, the rotatable reticle 306 may comprise a glass substrate respectively having reticle fields comprising a pattern etched in chrome or another blocking material. In some embodiments, the wafer identification mark 324 is a single, continuous exposed region within the photoresist layer 317.

In some embodiments, the rotatable reticle 306 may comprise a circular reticle. In some such embodiments, the plurality of different reticle fields 308 may be arranged in a circular pattern extending around an outer edge of the rotatable reticle 306, so that different reticle fields are exposed to the first type of electromagnetic radiation 304 as the rotatable reticle 306 spins. In some additional embodiments, the plurality of different reticle fields 308 may be arranged along multiple concentric circular patterns extending around a curve of a circular reticle. In such embodiments, the rotatable reticle 306 is configured to move in a first direction around the axis of rotation and in a second direction that is perpendicular to the axis of rotation.

A control unit 322 is operable coupled to a rotator 312, the first electromagnetic radiation source 302, and the first mobile wafer stage 314. The control unit 322 is configured to operate the rotator 312 to rotate the rotatable reticle 306 so that different reticle fields 308 can be used to form different wafer identification marks 324 on the photoresist layer 317 during different exposures of the first electromagnetic radiation source 302. For example, to form a letter 'A' the control unit 322 is configured to operate the rotator 312 to move the rotatable reticle 306 to a first orientation that allows a first reticle field (e.g., corresponding to a wafer identification mark 'A') of the rotatable reticle 306 to be exposed to the first type of electromagnetic radiation 304 during a first exposure of the first electromagnetic radiation source 302. The control unit 322 is subsequently configured to operate the first mobile wafer stage 314 to move the semiconductor wafer 316 and then to rotate the rotatable reticle 306 to a second orientation that allows a second reticle field (e.g., corresponding to a wafer identification mark 'B') of the rotatable reticle 306 to be exposed to the first type of electromagnetic radiation 304 during a second exposure of the first electromagnetic radiation source 302.

In some embodiments, a radiation guide 318 is configured to convey the first type of electromagnetic radiation 304 from the first electromagnetic radiation source 302 to one of the plurality of different reticle fields 308 without providing the first type of electromagnetic radiation 304 to the other plurality of different reticle fields 308. For example, the radiation guide 318 may provide the first type of electromagnetic radiation 304 to a first reticle field corresponding to a letter 'A' without providing the light to a second reticle field corresponding to a letter 'B'.

In some embodiments, the radiation guide 318 may comprise a hollow tube. The rotatable reticle 306 may extend into an opening 320 (e.g., a slot) in a sidewall of the hollow tube, so that one of the plurality of the different reticle fields 308 is exposed to the first type of electromagnetic radiation 304 as the rotatable reticle 306 rotates. In some such embodiments, the opening 320 may extend around a perimeter of the hollow tube so that the rotatable reticle 306 extends through the hollow tube. In other embodiments, the radiation guide 318 may comprise one or more lenses and/or mirrors configured to focus the first type of electromagnetic radiation 304 at a location that the plurality of different reticle fields 308 pass through during rotation of the rotatable reticle 306.

A wafer transfer robot 326 is configured to transfer the semiconductor wafer 316 from the first mobile wafer stage 314 to a second mobile wafer stage 328. The second mobile wafer stage 328 is configured to move along the first direction 340 and along the second direction 342. In some embodiments, the second mobile wafer stage 328 may comprise a vacuum wafer chuck.

The second lithographic exposure tool 327 comprises a second electromagnetic radiation source 330 configured to generate a second type of electromagnetic radiation 332. In some embodiments, the second electromagnetic radiation source 330 may comprise a stepper configured to expose an area of the semiconductor wafer 316 having a smaller size than the semiconductor wafer 316. In such embodiments, the stepper is configured to repeatedly expose the semiconductor wafer 316. In some embodiments, the second electromagnetic radiation source 330 may comprise an excimer laser.

The second type of electromagnetic radiation 332 is provided to an alignment mark reticle 334 arranged between the second electromagnetic radiation source 330 and the second mobile wafer stage 328 (i.e., platform). The alignment mark reticle 334 comprises one or more blocking patterns 335 (e.g., etched in chrome) corresponding to one or more alignment marks 336 that are to be exposed on the photoresist layer 317 overlying the semiconductor wafer 316. In some embodiments, the alignment mark reticle 334 comprises a substantially square reticle. In some embodiments, one or more lenses and/or mirrors 338 may be arranged between the alignment mark reticle 334 and the second mobile wafer stage 328.

Figure 4:
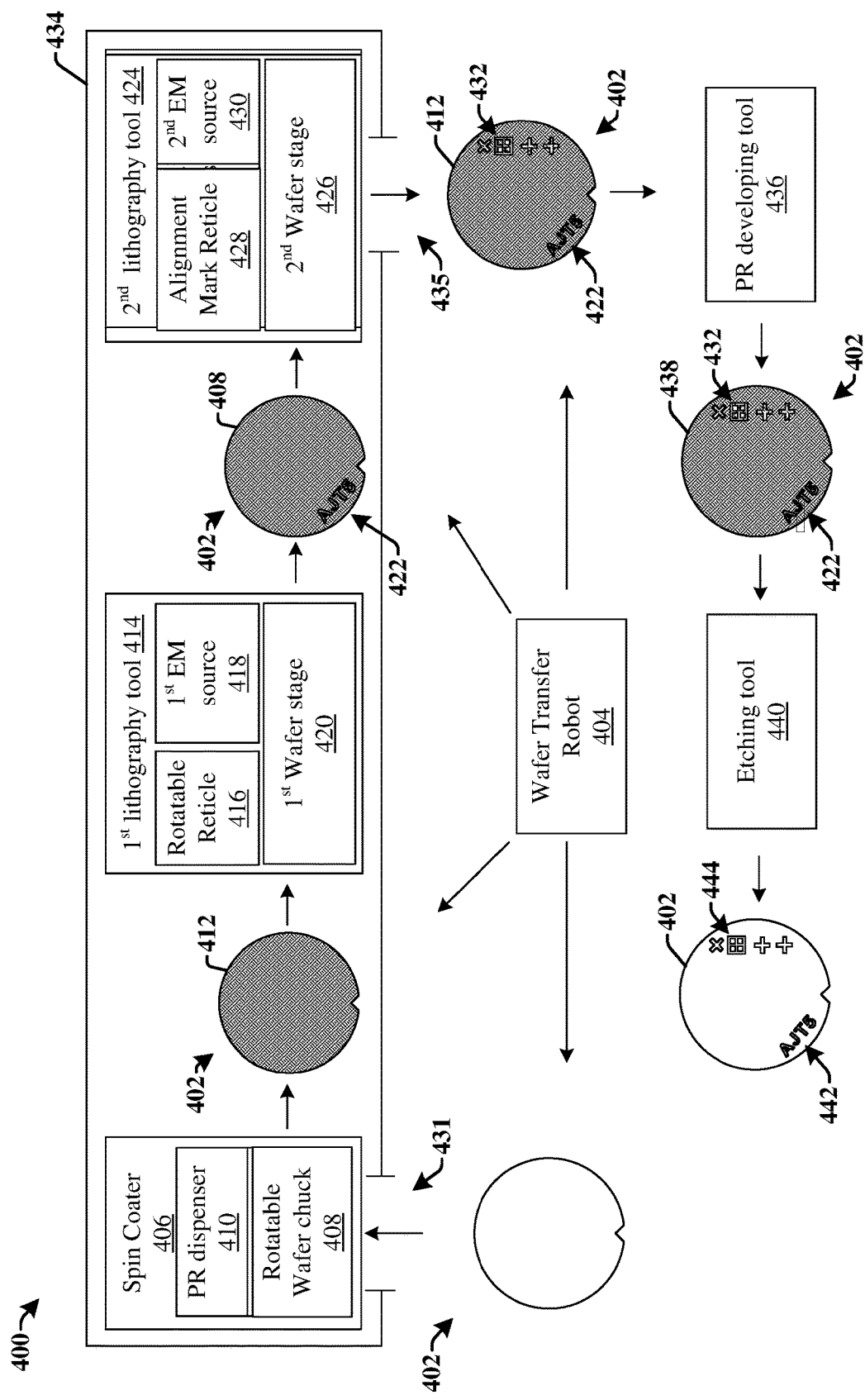
FIG. 4 illustrates some embodiments of a lithographic wafer engraving system configured to form wafer identification marks and alignment marks within a semiconductor substrate.

FIG. 4 illustrates some additional embodiments of a lithographic wafer engraving system 400 configured to form wafer identification marks and alignment marks within a semiconductor substrate.

The lithographic wafer engraving system 400 comprises a shared tool housing 434 comprising an inlet 431 configured to receive one or more semiconductor substrates 402 and an outlet 433 configured to output the one or more semiconductor substrates 402. In some embodiments, the one or more semiconductor substrates 402 may be provided to the inlet 431 by way of a wafer transfer robot 404. In some embodiments, the one or more semiconductor substrates 402 may be provided within a wafer carrier (e.g., a FOUP (Front Opening Unified Pod)). In other embodiments, the one or more semiconductor substrates 402 may provided by a wafer blade coupled to a wafer transfer robot 404.

The tool housing 434 encloses a spin coater 406, a first photolithography tool 414, and a second photolithography tool 424. The spin coater 406 is configured to deposit a layer of photoresist onto the one or more semiconductor substrates 402. In some embodiments, the spin coater 406 may comprise a rotatable wafer chuck 408 configured to hold a semiconductor substrate and to spin at a high rate of rotations per minute (RPMS). A photoresist dispensing element 410 is configured to provide photoresist to a semiconductor substrate as it spins, to form a photoresist layer 412 that is evenly distributed over a top surface of the semiconductor substrate.

The one or more semiconductor substrates 402 are provided from the spin coater 406 to a first mobile wafer stage 420 within the first photolithography tool 414. The first photolithography tool 414 comprises a first electromagnetic radiation source 418 that is configured to illuminate a part of a rotatable reticle 416. The rotatable reticle 416 has a plurality of separate reticle fields respectively comprising a pattern corresponding to a separate wafer identification mark. The rotatable reticle 416 is configured to rotate to selectivity expose a string of different wafer identification marks 422 onto the photoresist layer 412.

The one or more semiconductor substrates 402 are provided from the first mobile wafer stage 420 of the first photolithography tool 414 to a second mobile wafer stage 426 within a second photolithography tool 424. The second photolithography tool 424 comprises an alignment mark reticle 428 configured to selectively expose one or more alignment marks 432 within the photoresist layer 412. In some embodiments, wafer transfer robot 404 may move the semiconductor substrates 402 within the shared tool housing 434. In other embodiments, a separate wafer transfer robot may move the semiconductor substrates 402 within the shared tool housing 434.

The wafer transfer robot 404 is configured to transfer the one or more semiconductor substrates 402 from the outlet 435 of the tool housing 434 to a photoresist developing tool 436. The photoresist developing tool 436 is configured to remove portions of the photoresist layer 412 to form a patterned photoresist layer 438 over the one or more semiconductor substrates 402. In some embodiments, the photoresist developing tool 436 may comprise an aqueous photoresist developer, such as a TMAH (Tetramethylammonium Hydroxide) based developer or a KOH (Potassium hydroxide) based developer. In some embodiments, the photoresist developing tool 436 may be configured to submerge the one or more semiconductor substrates 402 into a bath of aqueous photoresist developer.

The wafer transfer robot 404 is configured to transfer the one or more semiconductor substrates 402 from the photoresist developing tool 436 to an etching tool 440. The etching tool 440 is configured to selectively etch the one or more semiconductor substrates 402 according to the patterned photoresist layer 438 to concurrently (i.e., simultaneously) form a plurality of wafer identification marks 442 and one or more alignment marks 444 as depressions within the one or more semiconductor substrates 402. In some embodiments, the etching tool 440 may comprise a dry etching tool. The dry etching tool may comprise a reactive ion etcher or a plasma etcher, for example. In other embodiments the etching tool 440 may comprise a wet etching bench.

FIG. 5-11 illustrates some embodiments of a method of forming wafer identification marks and alignment marks within a semiconductor substrate.

As shown in three-dimensional view 500, a semiconductor substrate 502 is provided. The semiconductor substrate 502 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The semiconductor substrate 502 may comprise an intrinsically doped semiconductor substrate having a first doping type (e.g., an n-type doping or a p-type doping).

A photosensitive material 504 is formed over the semiconductor substrate 502. In various embodiments, the photosensitive material 504 may comprise a photosensitive polymer such as a positive or negative photoresist. In some embodiments, the photosensitive material 504 may be formed onto the semiconductor substrate 502 by a spin coating process, which deposits the photosensitive material 504 onto the semiconductor substrate 502 as a liquid and then subsequently spins the semiconductor substrate 502 at a high rate of RPMS (e.g., between 1,000 and 10,000 RPM) to form a layer of photosensitive material having a uniform thickness.

As shown in three-dimensional view 600 and cross-sectional view 606, a first wafer identification mark 604 is exposed in the photosensitive material 504. In some embodiments, the first wafer identification mark 604 is exposed by selectively exposing the photosensitive material 504 to a first type of electromagnetic radiation using a rotatable reticle 306 having a plurality of different reticle fields 308. In such embodiments, the rotatable reticle 306 is rotated to a first orientation that selectively blocks the first type of electromagnetic radiation 602 according to a first one of the plurality of different reticle fields 308. The first type of electromagnetic radiation 602 causes portions of photosensitive material 504 to become less soluble (e.g., the light may cross-link exposed portions of a negative tone photoresist) to a photoresist developer.

As shown in three-dimensional view 700 and cross-sectional view 702, a second wafer identification mark 604 is exposed in the photosensitive material 504. In some embodiments, the second wafer identification mark 604 is exposed by rotating the rotatable reticle 306 around an axis of rotation 310 to a second orientation that selectively blocks the first type of electromagnetic radiation 602 according to a second one of the plurality of different reticle fields 308.

As shown in three-dimensional view 800 and cross-sectional view 808, one or more alignment marks 806 are exposed in the photosensitive material 504. In some embodiments, the one or more alignment marks 806 are exposed by selectively exposing the photosensitive material 504 using an alignment mark reticle 802. In some embodiments, the first type of electromagnetic radiation 602 and the second type of electromagnetic radiation 804 may be a same type of electromagnetic radiation (e.g., a UV light having a same wavelength). In other embodiments, the first type of electromagnetic radiation 602 and the second type of electromagnetic radiation 804 may be different types of electromagnetic radiation (e.g., a UV light having different wavelengths).

As shown in three-dimensional view 900 and cross-sectional view 910, a photoresist developer 902 may be used to remove the soluble areas of the photosensitive material 504. Removing soluble areas of the photosensitive material 504 results in a patterned photosensitive material 904 with cavities 912 that define wafer identification marks 906 and the one or more alignment marks 908.

As shown in cross-sectional view 1000, the semiconductor substrate 1002 is selectively etched by exposing the semiconductor substrate 1002 to an etchant 1004 according to the patterned photosensitive material 904. In various embodiments, the etchant 1004 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)). Etching the semiconductor substrate 1002 concurrently (i.e., simultaneously) forms a plurality of wafer identification marks 1006 and one or more alignment marks 1008 comprising depressions that extend into an upper surface of the semiconductor substrate 1002. The depressions of the wafer identification marks 1006 extend into the semiconductor substrate 1002 to a same depth d as the depressions of the alignment marks 1008.

As shown in cross-sectional view 1100, a remainder of the photosensitive material (e.g., 904 of FIG. 10) is removed. The remainder of the photosensitive material can be removed by exposing the photoresist to an etchant 1102 comprising a wet or a dry etchant.

Figure 11:
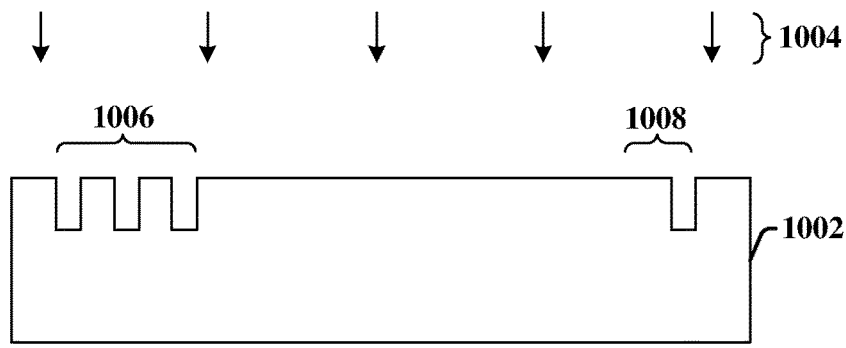
Figure 12:
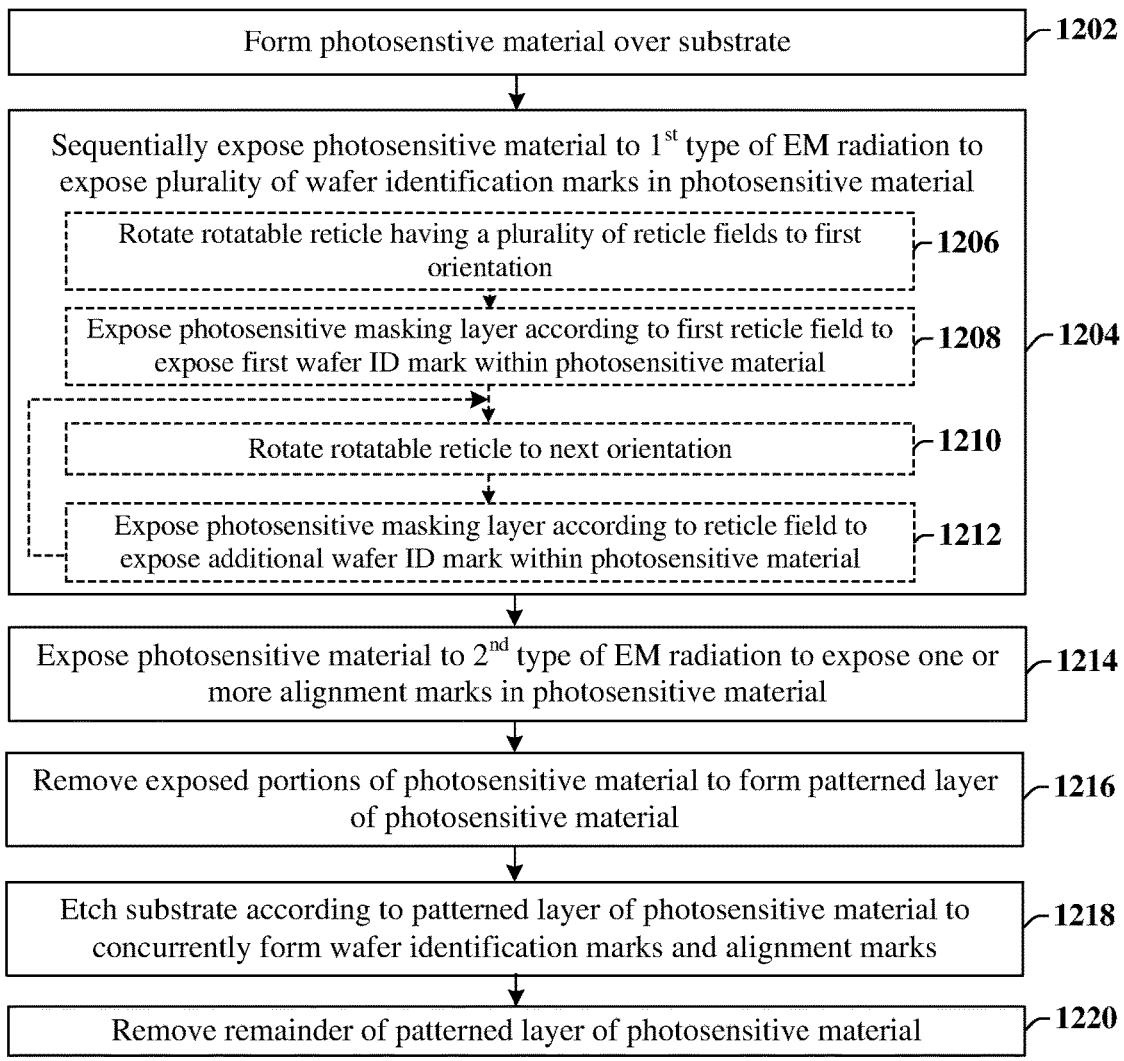
FIG. 12 illustrates a flow diagram of some embodiments of a method of forming wafer identification marks and alignment marks within a substrate.

FIG. 12 illustrates a flow diagram of some embodiments of a method 1200 of forming wafer identification marks and alignment marks within a substrate. Although method 1200 is described in relation to FIGS. 5-11, it will be appreciated that the method 1200 is not limited to such structures, but instead may stand alone as a method independent of the structures.

While the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
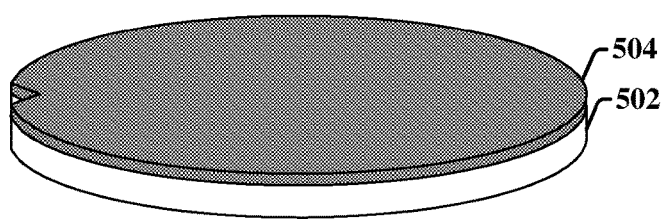
FIGS. 5-11 illustrate some embodiments of a method of forming wafer identification marks and alignment marks within a substrate.

At 1202, a photosensitive material is formed over a substrate. FIG. 5 illustrates some embodiments corresponding to act 1202.

Figure 6:
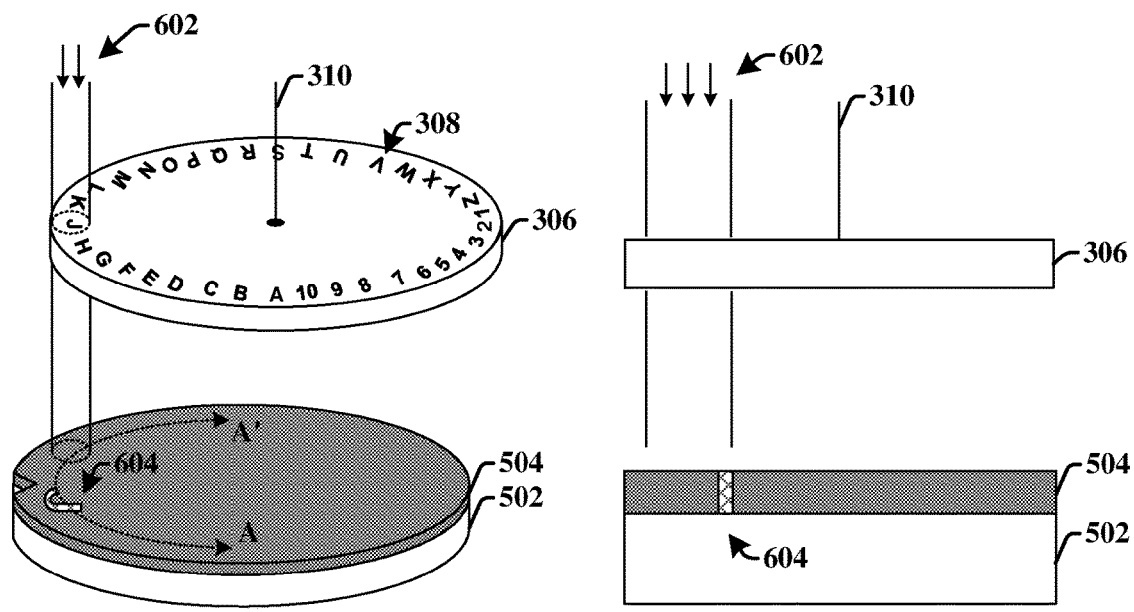
Figure 7:
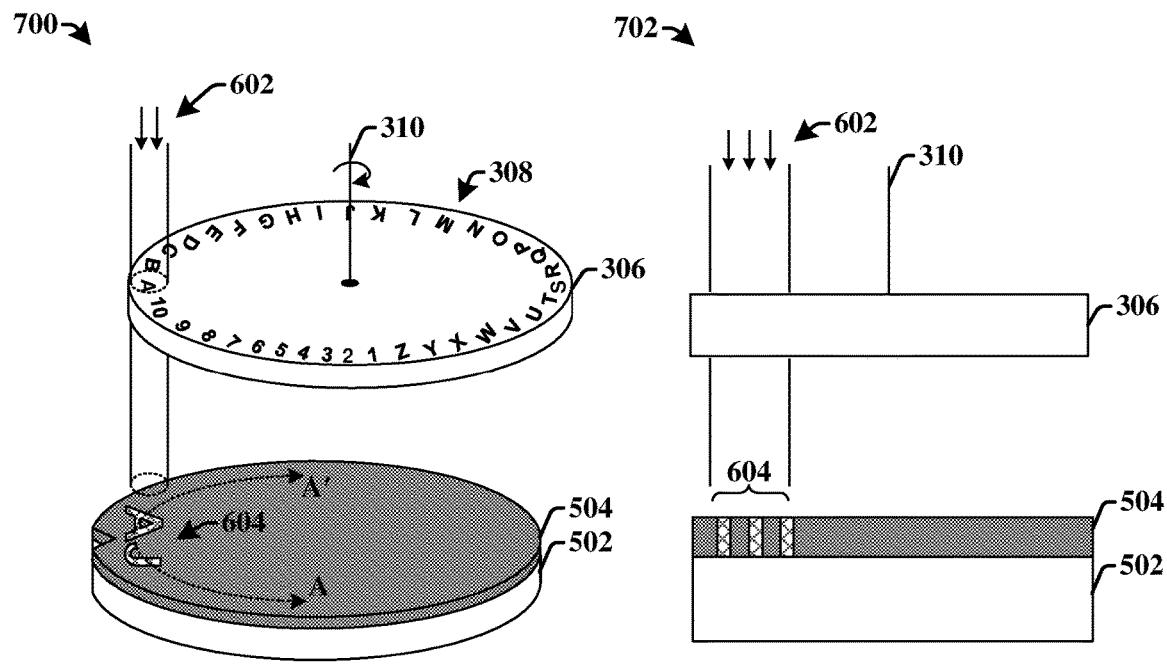

At 1204, a photosensitive material is sequentially exposed to a first type of electromagnetic radiation to form a plurality of wafer identification marks within the photosensitive material. In some embodiments, the photosensitive material may be sequentially exposed to the first plurality of reticle fields during a sequence of separate exposures (e.g., occurring one after another in time) of a lithographic exposure tool. FIGS. 6-7 illustrate some embodiments corresponding to act 1204.

In some embodiments, the photosensitive material may be exposed according to acts 1206-1212. At 1206, a rotatable reticle having a plurality of reticle fields is rotated to a first orientation. At 1208, the photosensitive material is exposed according to a first reticle field to expose a first wafer identification mark within the photosensitive material. At 1210, the rotatable reticle is rotated to next orientation. At 1212, the photosensitive material is exposed according to an additional reticle field of the rotatable reticle to expose an additional wafer identification mark within photosensitive material. It will be appreciated that acts 1210 and 1212 may be iteratively repeated to form a plurality of wafer identification marks on a substrate.

Figure 8:
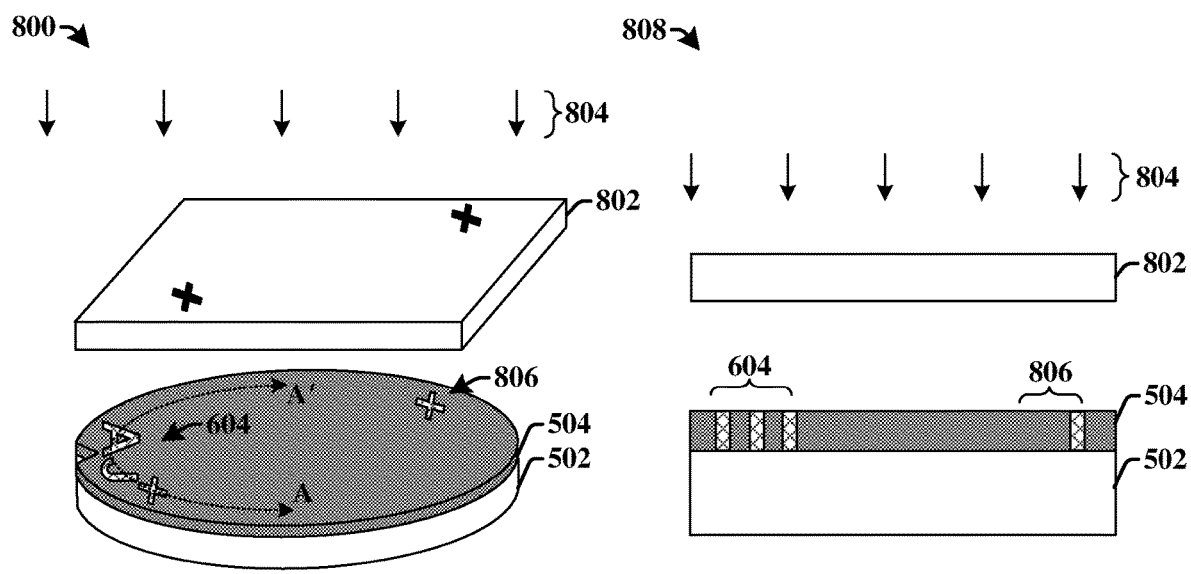

At 1214, a photosensitive material is exposed to a second type of electromagnetic radiation to expose one or more alignment marks within the photosensitive material. FIG. 8 illustrates some embodiments corresponding to act 1214.

Figure 9:
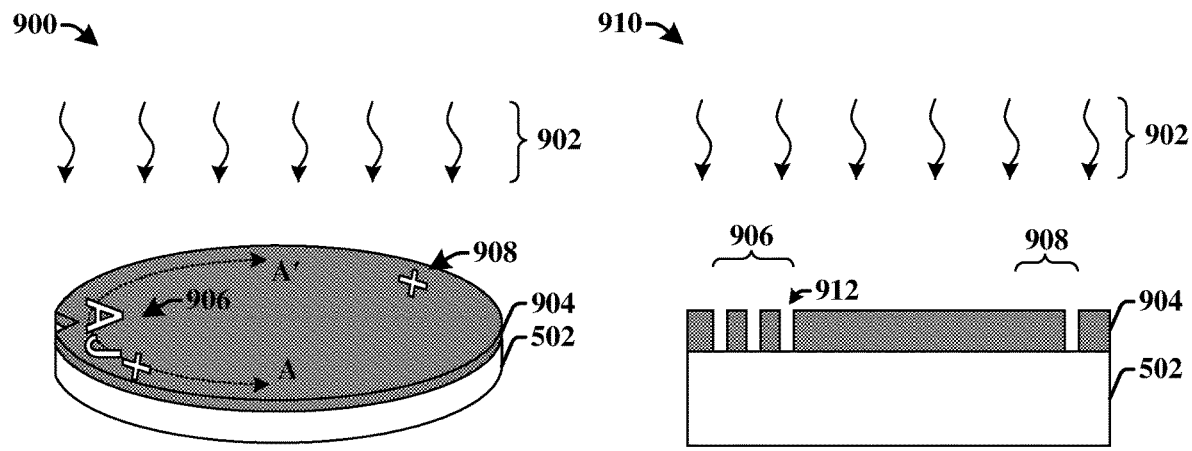

At 1216, exposed portions of the photosensitive material are removed to form a patterned layer of photosensitive material. FIG. 9 illustrates some embodiments corresponding to act 1216.

Figure 10:
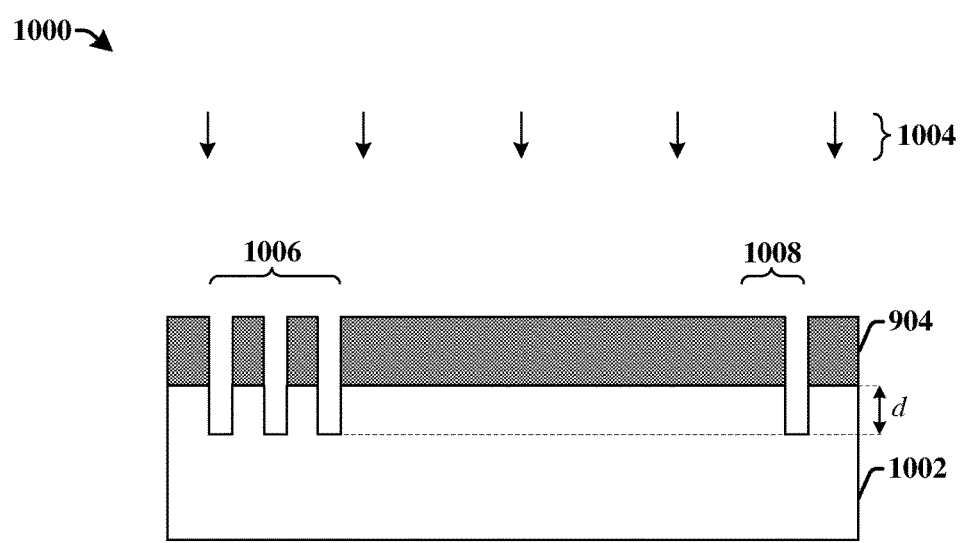

At 1218, the substrate is etched according to the patterned layer of photosensitive material to concurrently form mask identification marks and alignment marks within the substrate. FIG. 10 illustrates some embodiments corresponding to act 1218.

At 1220, a remainder of the photosensitive material is removed from the substrate. FIG. 11 illustrates some embodiments corresponding to act 1220.

Therefore, the present disclosure relates to a processing apparatus configured to perform a method of lithographic wafer marking.

In some embodiments, the present disclosure relates to a lithographic substrate marking tool. The marking tool comprises a first lithographic exposure tool arranged within a shared housing and configured to generate a first type of electromagnetic radiation during a plurality of exposures. The marking tool further comprises a mobile reticle comprising a plurality of different reticle fields respectively configured to block a portion of the first type of electromagnetic radiation to expose a substrate identification mark within a photosensitive material overlying a semiconductor substrate. The marking tool further comprises a transversal element configured to move the mobile reticle so that separate ones of the plurality of different reticle fields are exposed onto the photosensitive material during separate ones of the plurality of exposures.

In other embodiments, the present disclosure relates to a lithographic wafer marking tool. The marking tool comprises a first lithographic exposure tool arranged within a shared housing and configured to generate a first type of electromagnetic radiation. The marking tool further comprises a rotatable reticle configured to rotate about an axis of rotation extending through a center of the rotatable reticle. The rotatable reticle comprises a plurality of different reticle fields respectively configured to block a portion of the first type of electromagnetic radiation to expose a wafer identification mark within a photoresist layer over a substrate. The marking tool further comprises a second lithographic exposure tool arranged within the shared housing and configured to generate a second type of electromagnetic radiation. The marking tool further comprises an alignment mark reticle comprising one or more blocking patterns configured to block a portion of the second type of electromagnetic radiation to expose one or more alignment marks within the photoresist layer.

In yet other embodiments, the present disclosure relates to a method of forming substrate identification marks. The method comprises forming a photosensitive material over a substrate. The method further comprises sequentially exposing the photosensitive material to a first type of electromagnetic radiation to expose a plurality of wafer identification marks within the photosensitive material, and exposing the photosensitive material to second type of electromagnetic radiation to expose one or more alignment marks within the photosensitive material. The method further comprises removing exposed portions of photosensitive material to form a patterned layer of photosensitive material, and etching the substrate according to the patterned layer of photosensitive material to concurrently form mask identification marks and alignment marks within substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithographic substrate marking tool, comprising:
a first electromagnetic radiation source disposed within a housing and configured to generate a first type of electromagnetic radiation;
a radiation guide disposed upstream of a substrate stage configured to hold a substrate, the radiation guide comprising a hollow conduit having sidewalls that are configured to guide the first type of electromagnetic radiation to a photosensitive material over the substrate;
a second electromagnetic radiation source disposed within the housing and configured to generate a second type of electromagnetic radiation that is provided to the photosensitive material; and
a reticle having a plurality of reticle fields that are configured to block some of the first type of electromagnetic radiation from moving through the hollow conduit.

2. The lithographic substrate marking tool of claim 1, wherein the first electromagnetic radiation source comprises a light emitting diode.

3. The lithographic substrate marking tool of claim 1, wherein the first type of electromagnetic radiation is ultraviolet radiation.

4. The lithographic substrate marking tool of claim 1, wherein the first electromagnetic radiation source is coupled to a mobile table configured to move in a first direction and in a second direction perpendicular to the first direction.

5. The lithographic substrate marking tool of claim 1, further comprising:
a rotor configured to rotate the reticle around an axis that is parallel to a path of the first type of electromagnetic radiation.

6. The lithographic substrate marking tool of claim 5, wherein the plurality of reticle fields are arranged on the reticle in a circular pattern and correspond to numbers and letters.

7. The lithographic substrate marking tool of claim 1, wherein the radiation guide causes the first type of electromagnetic radiation to travel in a substantially straight line from the first electromagnetic radiation source to the photosensitive material.

8. The lithographic substrate marking tool of claim 1, further comprising:
a wafer transfer robot disposed within the housing and configured to transfer the substrate from the substrate stage in communication with the first electromagnetic radiation source to a second stage in communication with the second electromagnetic radiation source.

9. The lithographic substrate marking tool of claim 1,
wherein the first type of electromagnetic radiation is configured to expose a plurality of substrate identification marks within the photosensitive material; and
wherein the second type of electromagnetic radiation is configured to expose one or more alignment marks within the photosensitive material.

10. The lithographic substrate marking tool of claim 9,
wherein the plurality of substrate identification marks comprise first soluble regions within the photosensitive material and the one or more alignment marks comprise one or more second soluble regions within the photosensitive material; and
wherein the first soluble regions are laterally separated from the one or more second soluble regions by the photosensitive material.

11. A lithographic tool, comprising:
a first electromagnetic radiation source configured to generate a first type of electromagnetic radiation;
a radiation guide comprising a hollow conduit configured to provide the first type of electromagnetic radiation to a photosensitive material over a substrate; and
a reticle comprising a plurality of different reticle fields corresponding to a plurality of different substrate identification marks, wherein the reticle is arranged between a top and a bottom of the hollow conduit.

12. The lithographic tool of claim 11, wherein the reticle continuously extends from outside of the hollow conduit to within the hollow conduit.

13. The lithographic tool of claim 12, wherein parts of the reticle are configured to move from within an opening disposed along a sidewall of the hollow conduit to outside of the hollow conduit.

14. The lithographic tool of claim 11, wherein the first type of electromagnetic radiation has a wavelength in a range of between 250 nm and 500 nm and a power in range of between 5,000 mw/cm$^2$ and 15,000 mw/cm$^2$.

15. The lithographic tool of claim 11, wherein the first electromagnetic radiation source is configured to move along a first direction and along a second direction that is perpendicular to the first direction.

16. The lithographic tool of claim 11, wherein the radiation guide comprises one or more interior sidewalls defining the hollow conduit that is configured to guide the first type of electromagnetic radiation to the photosensitive material.

17. A lithographic tool, comprising:
a first lithographic exposure tool configured to generate a first type of electromagnetic radiation;
a radiation guide configured to provide the first type of electromagnetic radiation to a photosensitive material over a substrate to expose one or more substrate identification marks within the photosensitive material;
a reticle comprising a plurality of different reticle fields corresponding to a plurality of different substrate identification marks, wherein the radiation guide comprises a hollow conduit configured to provide the first type of electromagnetic radiation to the reticle prior to providing the first type of electromagnetic radiation to the photosensitive material and wherein the reticle continuously extends from outside of the hollow conduit to within the hollow conduit.

18. The lithographic tool of claim 17, wherein the hollow conduit has surfaces defining an opening in a sidewall of the hollow conduit, the reticle disposed within the opening.

19. The lithographic tool of claim 18, wherein the reticle is configured to rotate about an axis that is parallel to the sidewall of the hollow conduit, the sidewall vertically above and below the reticle.

20. The lithographic substrate marking tool of claim 1, wherein the reticle is arranged between a top and a bottom of the hollow conduit.

* * * * *